US007095243B1

United States Patent
Davis

(10) Patent No.: US 7,095,243 B1
(45) Date of Patent: Aug. 22, 2006

(54) AC GENERATOR EXCITER ROTOR SLIP-RING TEST APPARATUS

(75) Inventor: Randall D. Davis, Claremore, OK (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/179,689

(22) Filed: Jul. 11, 2005

(51) Int. Cl.
G01R 31/34 (2006.01)
(52) U.S. Cl. .................. 324/772; 310/239; 310/112
(58) Field of Classification Search ............ 310/71, 310/232, 239–245, 68 R, 89, 68 D, 112, 310/113–114; 324/772
See application file for complete search history.

(56) References Cited

U.S. PATENT DOCUMENTS

| | | | |
|---|---|---|---|
| 2,417,783 A * | 3/1947 | Pollard et al. ................. 310/55 |
| 2,780,949 A * | 2/1957 | Hoy ............................ 81/486 |
| 3,976,903 A * | 8/1976 | Cotton ....................... 310/232 |
| 4,219,739 A * | 8/1980 | Greenwell .................... 290/46 |
| 4,485,678 A | 12/1984 | Fanuele |
| 4,492,999 A | 1/1985 | Amagasa |
| 4,671,117 A | 6/1987 | Movick |
| 5,184,039 A * | 2/1993 | Kraft ............................ 310/89 |
| 5,231,374 A | 7/1993 | Larsen et al. |
| 5,254,896 A | 10/1993 | Bradfield et al. |
| 5,625,244 A * | 4/1997 | Bradfield .................... 310/232 |
| 5,773,906 A | 6/1998 | Mukai et al. |
| 5,789,667 A | 8/1998 | Leader et al. |
| 6,294,856 B1 | 9/2001 | Ishida et al. |
| 2004/0124870 A1 | 7/2004 | Ralchle |

* cited by examiner

*Primary Examiner*—Vinh Nguyen
*Assistant Examiner*—Arleen M. Vazquez
(74) *Attorney, Agent, or Firm*—Ingrassia Fisher & Lorenz

(57) ABSTRACT

A test apparatus assembly is provided for testing an AC generator having an exciter rotor mounted to a shaft. The apparatus includes an annular end bell, a carbon brush assembly coupled to the end bell including a housing coupled to the end bell inner peripheral surface, at least a conduit formed in the housing, and a spring-loaded carbon brush disposed in the conduit, and a slip ring assembly configured to be mounted to the shaft and to at least partially contact the carbon brush that includes a hub configured to couple to the shaft, the hub including an outer peripheral surface and a cavity extending therethrough, a first slip ring coupled to the hub outer peripheral surface, and a wire connector coupled to the first slip ring and extending through the hub cavity, the wire connector configured to electrically couple the first slip ring to the exciter rotor.

12 Claims, 4 Drawing Sheets

AC GENERATOR EXCITER ROTOR SLIP-RING TEST APPARATUS

TECHNICAL FIELD

The present invention relates to AC generators and, more particularly, to an apparatus for testing an exciter rotor of an AC generator.

BACKGROUND

Alternating current (AC) generators are used for myriad applications, for example, in a gas turbine engine, such as that found in aircraft, ships, and some terrestrial vehicles. These generators may include three separate brushless generators, namely, a permanent magnet generator (PMG), an exciter, and a main generator. Each of these generators may include rotors and stators. When the rotor rotates, AC currents are induced in stator windings of the generator.

Periodically, an AC generator may need to undergo static and dynamic electrical performance testing. The test results allow an operator to determine the electrical integrity of the wires and/or coils therein and to assess the scope of repair or overhaul that the generator may need to undergo. Accordingly, the AC generator first may be separated from the engine and temporarily mounted to a test stand. Multiple test instruments are connected to the appropriate sections of the AC generator to obtain the appropriate readings therefrom.

Although conventional methods of testing electrical integrity of AC generators have been effective, these methods suffer from certain drawbacks. For example, typically, the exciter rotor is not directly tested. Instead, measurements for surrounding components are obtained and test data relating to the exciter rotor are calculated therefrom. As a result, the calculation may not be as accurate as desired. Additionally, because the exciter rotor is typically accessed and bench-tested while it is inactive, the condition of the exciter rotor during operation may not be assessed correctly. In either case, the operator may conclude that the exciter rotor, and hence, the AC generator, needs a larger scope of repair or overhaul than needed, which may unnecessarily increase the cost of repair.

Hence, there is a need for a device for testing an AC generator that is capable of directly testing the AC generator rotor. Additionally, it is desirable to have a device that is capable of assessing the condition of the generator during operation. The present invention addresses one or more of these needs.

BRIEF SUMMARY

The present invention provides a test apparatus assembly for testing an AC generator having an exciter rotor mounted to a shaft. In one embodiment, and by way of example only, the assembly includes an annular end bell, a carbon brush assembly coupled to the end bell including a housing coupled to the end bell inner peripheral surface, at least a conduit formed in the housing, and a spring-loaded carbon brush disposed in the conduit, and a slip ring assembly configured to be mounted to the shaft and to at least partially contact the carbon brush that includes a hub configured to couple to the shaft, the hub including an outer peripheral surface and a cavity extending therethrough, a first slip ring coupled to the hub outer peripheral surface, and a wire connector coupled to the first slip ring and extending through the hub cavity, the wire connector configured to electrically couple the first slip ring to the exciter rotor.

In another exemplary embodiment, the assembly includes an annular end bell, a housing, a cavity, a carbon brush, a hub, a first slip ring, and a wire connector. The annular end bell has an inner peripheral surface defining an opening configured to receive the shaft. The housing is coupled to the end bell inner peripheral surface. At least one cavity is formed in the housing. The spring-loaded carbon brush is disposed in the conduit. The hub is configured to couple to the shaft and includes an outer peripheral surface and a cavity. The first slip ring is coupled to the hub outer peripheral surface. The wire connector is coupled to the first slip ring and extends through the hub cavity, and is configured to electrically couple the first slip ring to the exciter rotor.

Other independent features and advantages of the preferred test apparatus assembly will become apparent from the following detailed description, taken in conjunction with the accompanying drawings which illustrate, by way of example, the principles of the invention.

DETAILED DESCRIPTION OF A PREFERRED EMBODIMENT

Before proceeding with the detailed description, it is to be appreciated that the present invention is not limited to use in conjunction with a specific type of electrical machine. Thus, although the present embodiment is, for convenience of explanation, depicted and described as being employed with a brushless AC (alternating current) generator, it will be appreciated that it can be employed with other AC generator designs.

Figure 1:
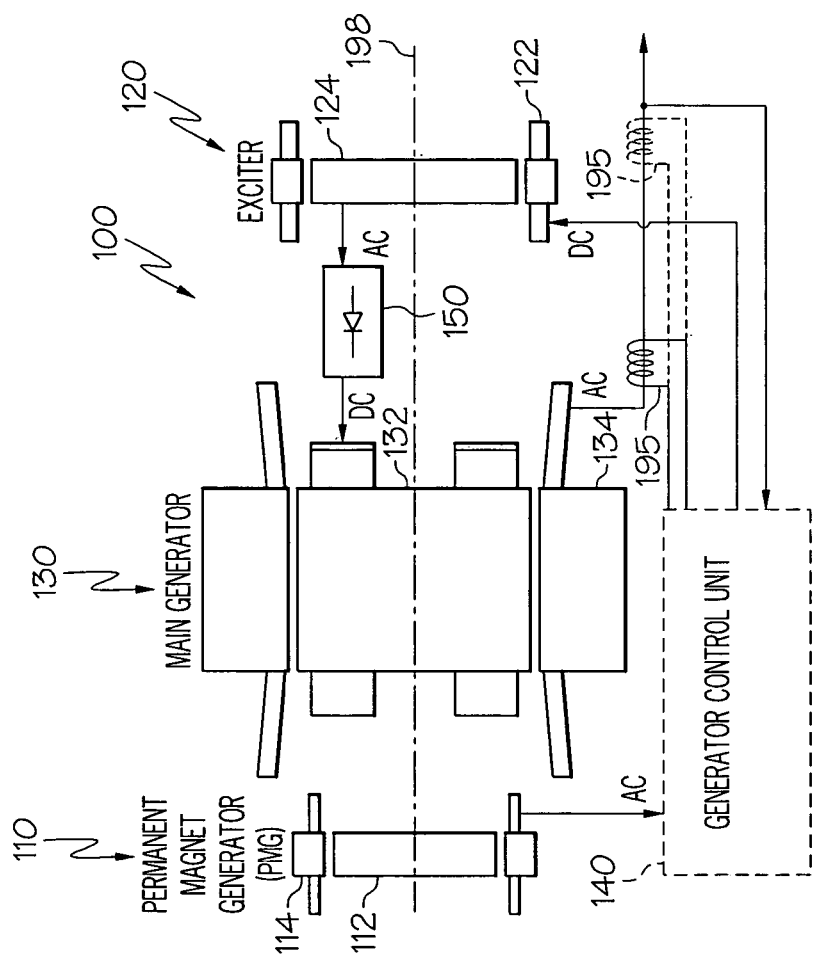
FIG. 1 is a functional schematic block diagram of an exemplary high speed generator system.

Turning now to the description, and with reference first to FIG. 1, a functional schematic block diagram of an exemplary high speed generator system 100 for use with a gas turbine engine such as that in an aircraft is depicted. This exemplary generator system 100, which is commonly known as a brushless AC generator, includes a permanent magnet generator (PMG) 110, an exciter 120, a main generator 130, a generator control unit 140, and one or more rectifier assemblies 150. During operation, a rotor 112 of the PMG 110, a rotor 124 of the exciter 120, and a rotor 132 of the main generator 130 may all rotate at the same speed. In one embodiment, the rotational speed may be, for example, in the range of about 12,000 to about 24,000 r.p.m., or greater. As the PMG rotor 112 rotates, AC power is generated by a PMG stator 114 and supplied to the generator control unit 140. The AC power, in turn, is rectified and supplied as direct current (DC) power to a stator 122 of the exciter 120. The exciter rotor 124 in turn supplies AC power to the rectifier assemblies 150. The output from the rectifier assemblies 150 is DC power and is supplied to the main generator rotor 132. As the main generator rotor 132 rotates, magnetic flux lines are created about alternating north and south poles which induce an AC voltage into the main generator stator 134.

The generator system 100 is capable of providing output power at a variety of power levels and over a variety of frequency ranges. Further, typically the output power from the main generator stator 134 is three-phase AC power. The generator control unit 140 can regulate the power output based upon monitoring signals provided to it from monitoring devices 195. In the depicted embodiment, the PMG rotor 112, the exciter rotor 124, and the main generator rotor 132 all rotate along a single axis 198 at the same rotational speed. It will be appreciated, however, that in other embodiments the PMG rotor 112 may rotate along a different axis. Moreover, the relative positioning of the PMG 110, the exciter 120, and the main generator 130 can be modified in different embodiments such that the exciter 120 is physically between the PMG 110 and the main generator 130.

Figure 2:
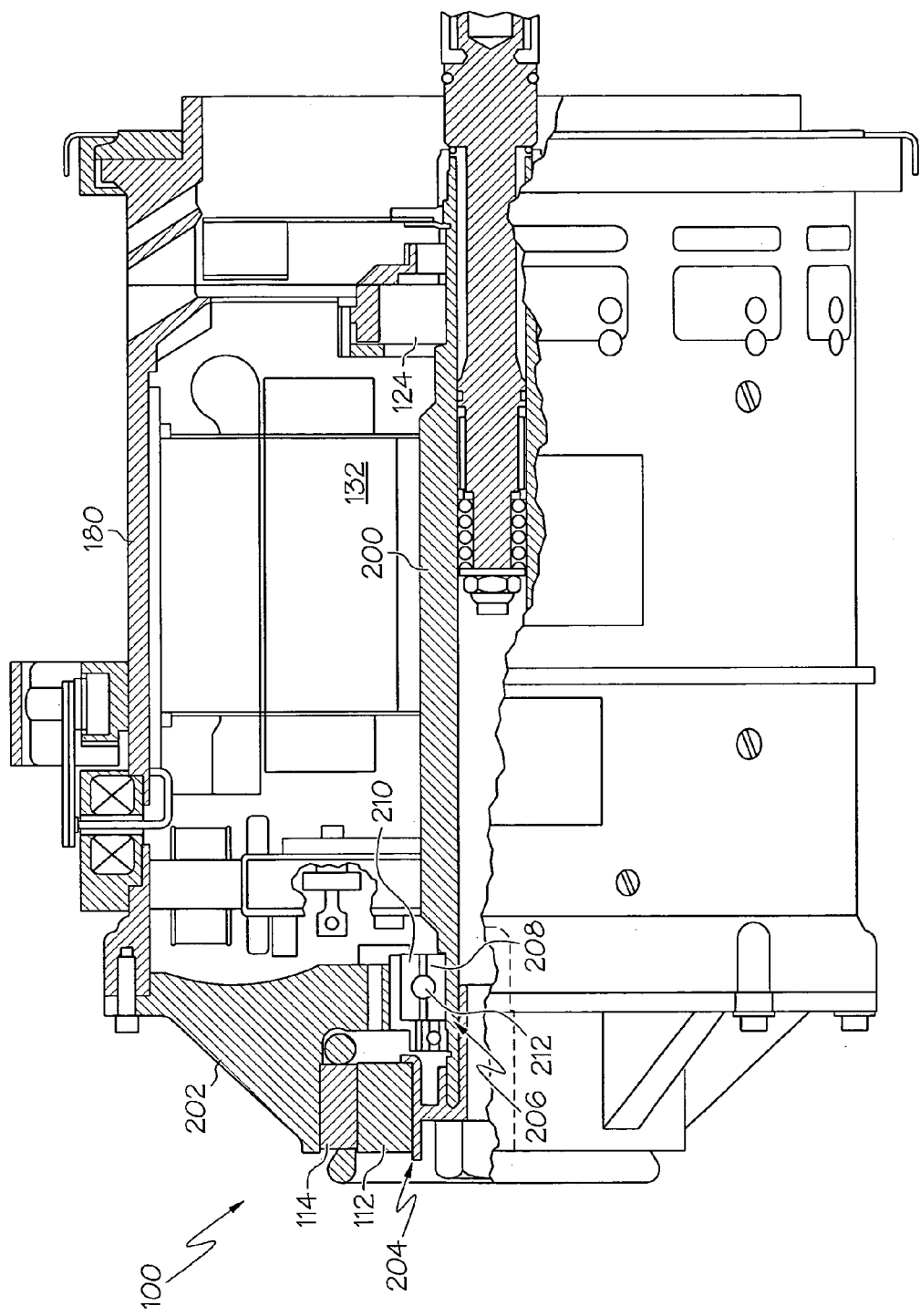
FIG. 2 is a cross-sectional view of a physical embodiment of the generator system depicted in FIG. 1.

A partial cross section of a physical embodiment of at least a portion of the generator system 100 is provided in FIG. 2. The generator system 100 includes a shaft 200 that extends through and rotates in the generator housing 180. The PMG rotor 112, main generator rotor 132, and exciter rotor 124 are all mounted on the shaft 200. To reduce friction between the shaft 200 and other components during rotation, a bearing assembly 206 is employed. The bearing assembly 206 includes an inner race 208, an outer race 210, and at least one bearing 212. The inner race 208 is coupled to the shaft 200 and rotates therewith. The bearing 212 is mounted between the inner race 208 and outer race 210. An end bell 202 is mounted to one end of the housing 180 and has an opening 204 formed therein. The opening 204 is configured to provide space through which the shaft 200 extends and within which the PMG stator 114, the PMG rotor 112, and the bearing assembly 206 are disposed.

Figure 3:
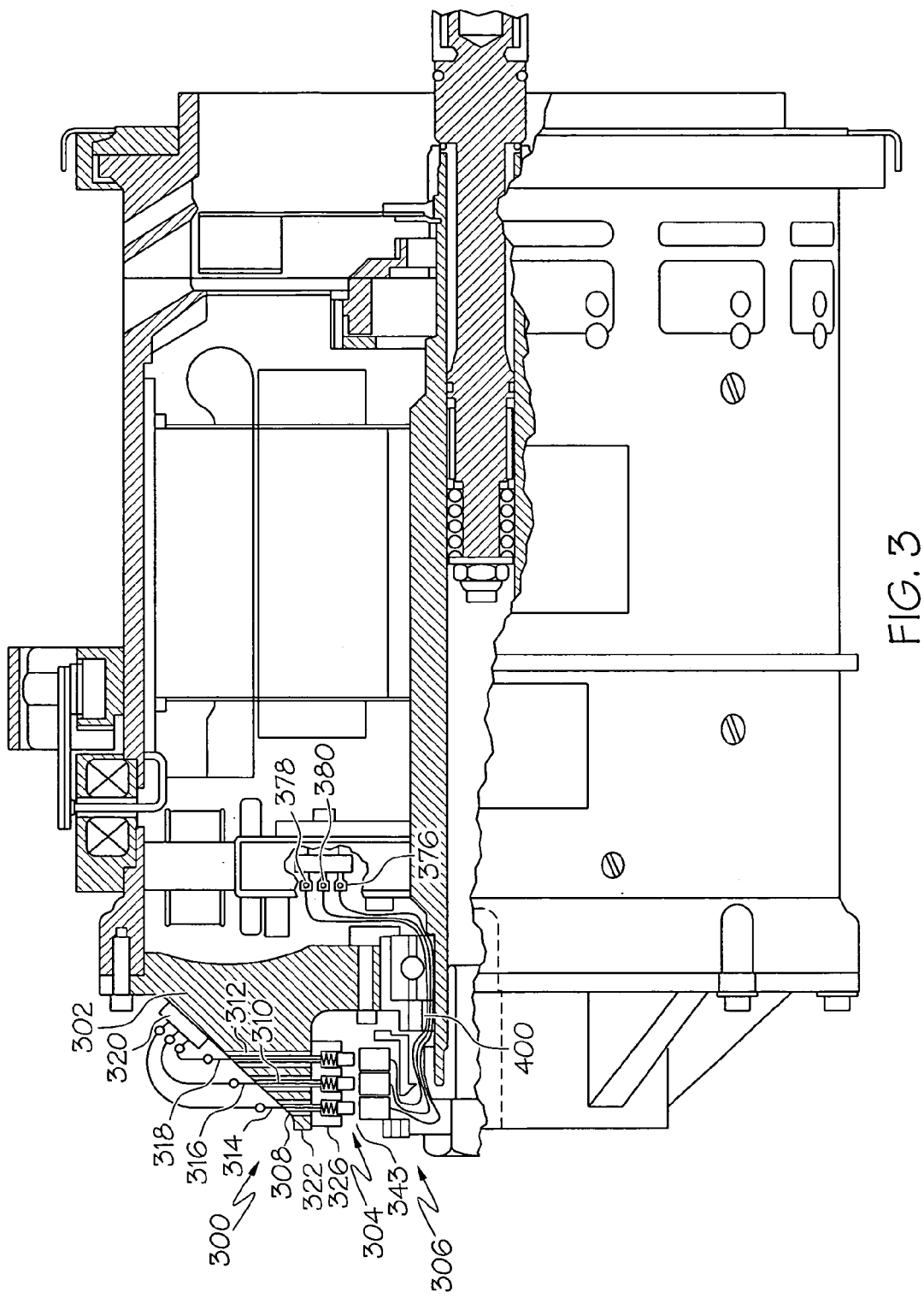
FIG. 3 is a cross-sectional view of an exemplary AC generator exciter rotor slip-ring test assembly coupled to a generator.
Figure 4:
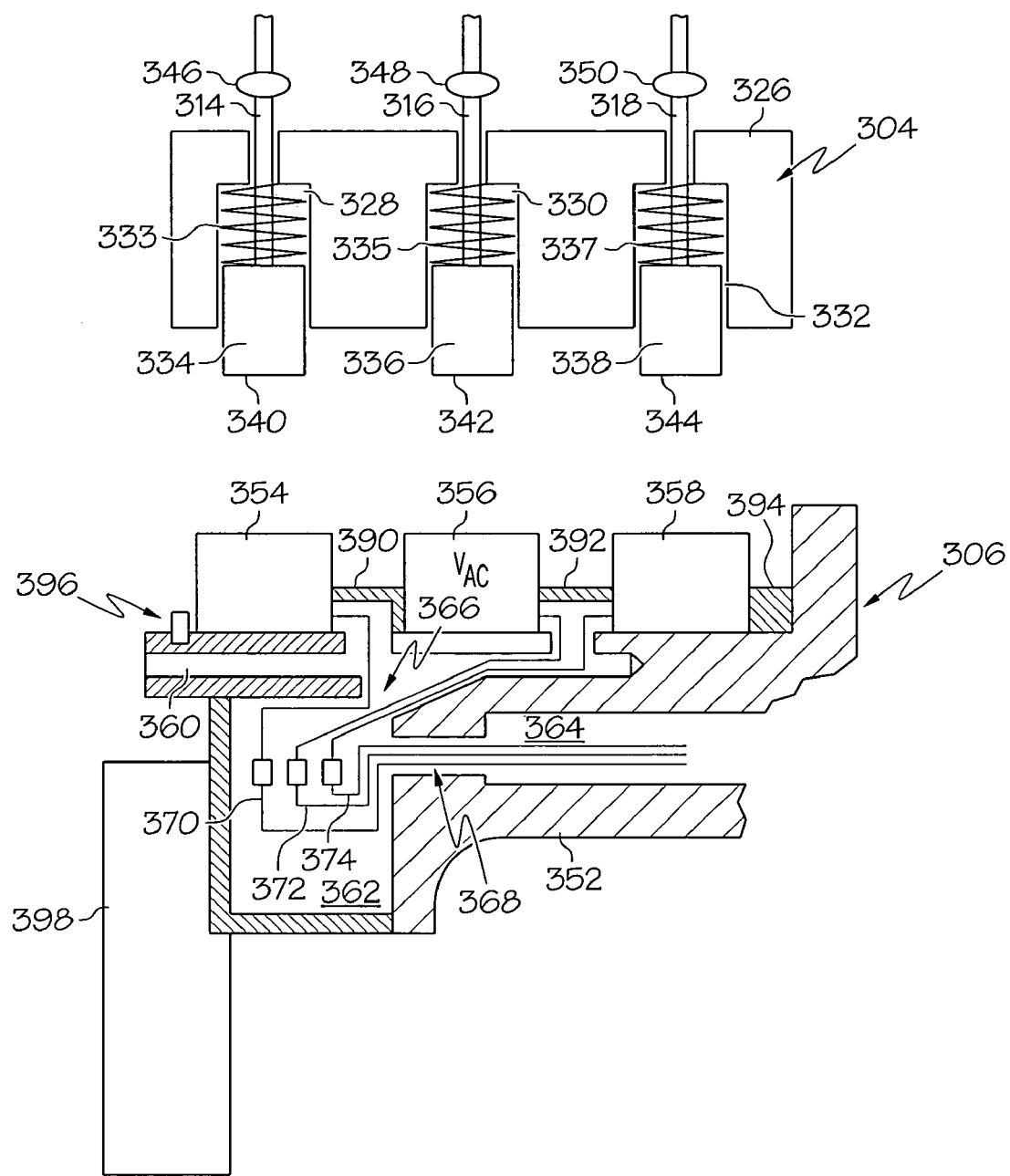
FIG. 4 is a close-up view of a cross section of an exemplary brush assembly and an exemplary slip ring assembly.

When the generator system 100 needs to be tested, the end bell 202, the PMG rotor 112, and the PMG stator 214 are removed from the generator system 100 and replaced with a test assembly apparatus, such as the test assembly apparatus 300 illustrated in FIGS. 3 and 4. The test assembly apparatus 300 includes a test end bell 302, a brush assembly 304, and a slip ring assembly 306.

The test end bell 302 is preferably configured similar to the generator end bell 202 and includes an opening 343. The opening 343 is suitably configured to provide space within which the brush assembly 304, slip ring assembly 306, and shaft 200 may reside. The test end bell 302 may also include channels 308, 310, 312 formed therein and a terminal block 320 mounted to its outer surface 322. It will be appreciated that test instruments may be electrically coupled to the terminal block 320 and may also be electrically coupled to the brush assembly 304 via the channels 308, 310, 312.

With reference to FIGS. 3 and 4, the brush assembly 304 includes a housing 326 that couples to the test end bell 302. The housing 326 may be constructed of any one of numerous non-conductive materials conventionally used for manufacturing test equipment, such as, phenolic, or any other similar material having thermal stability. In a preferred embodiment, the housing 326 includes a plurality of cavities 328, 330, 332 formed therethrough that are suitably configured to at least partially house carbon brushes 334, 336, 338. Although three carbon brushes 334, 336, 338 are depicted in the figures, it will be appreciated that fewer or more may alternatively be employed.

No matter the particular number of carbon brushes, each brush 334, 336, 338 has a contact surface 340, 342, 344 that is configured to contact at least a portion of the slip ring assembly 306. In this regard, the carbon brushes 334, 336, 338 are preferably suitably spring-loaded to supply an appropriate amount of force thereto and to cause the contact between the brushes 334, 336, 338 and the slip ring assembly 306. Any one of numerous devices used for spring-loading may be employed, such as, for example, springs 333, 335, 337. Because the springs 333, 335, 337 bias the brushes 334, 336, 338 away from the housing 326, retention clips 346, 348, 350 may be included to retain the carbon brushes 334, 336, 338 in the housing 326. The retention clips 346, 348, 350 may be disposed in any suitable section of the housing 326, such as, for example, within the cavities 328, 330, 332. A plurality of wires 314, 316, 318 electrically couples each carbon brush 334, 336, 338 to the terminal block 320. The wires 314, 316, 318 may be threaded through the test end bell channel 308, 310, 312, briefly mentioned above, to conduct current to the terminal block 320.

The slip ring assembly 306 includes a hub 352 and slip rings 354, 356, 358. The hub 352 is configured to mount on the shaft 200 and may be bolted thereto using a retaining bolt 398. The hub 352 preferably has a configuration similar to that of a conventional PMG rotor hub (not illustrated) and may be constructed of any material conventionally used for a PMG rotor hub. For example, the hub 352 may be constructed of any one of numerous non-conductive materials, such as phenolic or any other plastic material having thermal stability. The hub 352 includes a plurality of cavities 360, 362, 364 and openings 366, 368. The openings 366, 368 are formed in the hub 352 to thereby provide fluid communication between each of the cavities 360, 362, 364.

The slip rings 354, 356, 358 are mounted to an outer surface of the hub 352 and are configured to correspond to and contact the carbon brushes 334, 336, 338. In a preferred embodiment, the number of slip rings 354, 356, 358 included in the assembly 306 corresponds with the number of carbon brushes 334, 336, 338. However, it will be appreciated that any other suitable number of slip rings may alternatively be employed.

Each slip ring 354, 356, 358 is configured to electrically couple to a component within the generator system 100. In one exemplary embodiment, as shown in FIGS. 3 and 4, the middle slip ring 356 is configured to electrically couple to an electrical contact on one of the AC components in the generator system 100, such as, for example, a diode terminal 376 that is electrically coupled to the exciter rotor 124. One of the outer slip rings 354 is configured to electrically couple to an electrical contact on one of the DC components, such as to a diode terminal 378 that is electrically coupled to the main generator rotor 132, while the other outer slip ring 358 is configured to electrically couple to a common ground electrical contact, such as, for example, a common diode terminal 380. It will be appreciated that the slip rings 354, 356, 358 may alternatively be positioned in any other order. Wire connectors 370, 372, 374 are used to electrically couple the slip rings 354, 356, 358 to the corresponding electrical contacts (e.g. the diodes 376, 378).

The slip rings 354, 356, 358 are spaced apart from each other by spacers 390, 392, 394. The spacers 390, 392, 394 may be made of any one of numerous non-conductive materials, such as phenolic or any plastic material having thermal stability. To prevent the slip rings 354, 356, 358 from moving axially along the shaft 200, a conventional locking device, such as a spiral lock 396, may be coupled to and extended from the hub 352.

Referring back to FIG. 3, when the test assembly apparatus 300 is to be used, the end bell 202, PMG rotor 112, PMG stator 114, and bearing assembly 206 are removed from the generator system 100. A groove 382 is machined through the bottom portion of the bearing assembly 206, for example, below the inner race 208. The bearing assembly 206 is mounted back onto the shaft 200 and the wire connectors 370, 372, 374 of the slip ring assembly 306 are threaded through the channel 400. The wire connectors 370, 372, 374 are then appropriately coupled to electrical contacts within the generator system 100, such as, for example, to diodes 376, 378, 380. It will be appreciated that the slip ring assembly 306 may be mounted on the shaft 200 either before or after the wire connectors 370, 372, 374 are connected to the electrical contacts.

Next, the brush assembly 304 is mounted to the generator system 100. In one exemplary embodiment, the brush assembly 304 is pre-coupled to the test end bell 302, and the test end bell 302 is mounted to the generator housing 180. In another exemplary embodiment, the brush assembly 304 is mounted to the shaft 200, and the test end bell 302 is subsequently coupled to the generator housing 180.

After the test apparatus assembly 300 is appropriately mounted, the generator system 100, in particular, the terminal block 320, is connected to various test instruments, such as, for example, a two-channel oscilloscope, a DC voltmeter, or a DC ammeter. The generator system 100 is then rotated by a prime mover (not shown) which causes the shaft 200 and rotors 112, 132, 124 to rotor and then excited with an external DC power supply (not shown). The carbon brushes 334, 336, 338 pass over the slip rings 354, 356, 358 and supply voltage signals to the terminal block 320. Consequently, the instruments collect data from the generator system 100 and the operator uses the data to assess whether to repair or overhaul the system 100.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A test apparatus assembly for testing an AC generator having an exciter rotor mounted to a shaft, the apparatus comprising:
   an annular end bell having an outer peripheral surface, an inner peripheral surface defining an opening configured to receive the shaft, and a channel extending between the outer and inner peripheral surfaces;
   a carbon brush assembly coupled to the end bell inner peripheral surface, the carbon brush assembly comprising:
      a housing coupled to the end bell inner peripheral surface;
      at least a conduit formed in the housing in communication with the channel;
      a spring-loaded carbon brush disposed in the conduit; and
      a wire connector coupled to the carbon brush and extending through the channel; and
   a slip ring assembly configured to be mounted to the shaft and to at least partially contact the carbon brush, the slip ring assembly comprising:
      a hub configured to couple to the shaft, the hub including an outer peripheral surface and a cavity extending therethrough;
      a first slip ring coupled to the hub outer peripheral surface; and
      a wire connector coupled to the first slip ring and extending through the hub cavity, the wire connector configured to electrical couple the first slip ring to the exciter rotor.

2. The test apparatus assembly of claim 1, further comprising a terminal block coupled to the end bell outer surface.

3. The test apparatus assembly of claim 2, wherein the wire connector is further coupled to the terminal block.

4. The test apparatus assembly of claim 3, wherein the carbon brush assembly further comprises:
   a retention clip disposed within the conduit and in contact with the spring-loaded carbon brush.

5. The test apparatus assembly of claim 1, wherein the AC generator further includes a main generator rotor coupled to the shaft and the test apparatus assembly further comprises a second slip ring configured to be electrically coupled to the main generator rotor.

6. The test apparatus assembly of claim 1, wherein the hub includes a lock configured to retain the slip ring on the hub.

7. The test apparatus assembly of claim 1, further comprising:
   a second slip ring mounted coupled to the hub outer peripheral surface; and
   a spacer disposed between the first slip ring and the second slip ring.

8. A test apparatus assembly for an AC generator having an exciter rotor mounted therein mounted to a shaft extending therethrough, the assembly comprising:
   an annular end bell having an outer peripheral surface, an inner peripheral surface defining an opening configured to receive the shaft, and a channel extending between the outer and inner peripheral surfaces;
   a housing coupled to the end bell inner peripheral surface;
   at least a conduit formed in the housing in communication with the channel;
   a spring-loaded carbon brush disposed in the conduit;
   a wire connector coupled to the carbon brush and extending through the channel;
   a hub configured to couple to the shaft, the hub including an outer peripheral surface and a cavity;
   a first slip ring coupled to the hub outer peripheral surface; and
   a wire connector coupled to the first slip ring and extending through the hub cavity, the wire connector configured to electrically couple the first slip ring to the exciter rotor.

9. The test apparatus assembly of claim 8, further comprising a terminal block coupled to the end bell outer peripheral surface.

10. The test apparatus assembly of claim 9, wherein the wire connector is further coupled to the terminal block.

11. The test apparatus assembly of claim 8, wherein the AC generator includes a main generator rotor coupled to the shaft and the test apparatus assembly further comprises a second slip ring coupled to the hub outer peripheral surface and configured to be electrically coupled to a common ground of the generator.

12. The test apparatus assembly of claim 8, wherein the hub includes a lock configured to retain the slip ring on the hub.

* * * * *